United States Patent [19]
Trimberger

[11] Patent Number: 6,016,063
[45] Date of Patent: Jan. 18, 2000

[54] METHOD AND APPARATUS FOR CONNECTING LONG LINES TO FORM WIDE LOGIC FUNCTIONS

[75] Inventor: Stephen M. Trimberger, San Jose, Calif.

[73] Assignee: Xilinx, Inc., San Jose, Calif.

[21] Appl. No.: 09/018,281

[22] Filed: Feb. 4, 1998

[51] Int. Cl.$^7$ .............................................. H03K 19/0175
[52] U.S. Cl. .................................. 326/81; 326/39; 326/41
[58] Field of Search ................................. 326/37, 38, 39, 326/41, 47

[56] References Cited

U.S. PATENT DOCUMENTS

| | | | |
|---|---|---|---|
| 5,140,193 | 8/1992 | Freeman et al. ........................ | 326/41 |
| 5,677,638 | 10/1997 | Young et al. ............................ | 326/39 |

OTHER PUBLICATIONS

"The Programmable Logic Data Book", published Sep., 1996, available from Xilinx, Inc., 2100 Logic Drive, San Jose, California 95124, pp. 3–5 to 3–11 and 4–5 to 4–78.

*Primary Examiner*—Michael Tokar
*Assistant Examiner*—Anh Tran
*Attorney, Agent, or Firm*—Lois D. Cartier

[57] ABSTRACT

The present invention provides a method and apparatus for combining tristate buffers into wide logic functions. The invention provides for an arbitrary number of drivers to be accommodated on a single line in a circuit wherein the number of tristate buffers coupled to the line is limited. A plurality of long lines are used to implement wired logic functions, and the lines are then combined to implement wired logic functions wider than can be accommodated by a single long line. In one embodiment, each of the long lines is coupled to an input of a CLB to combine the portions of the logic function into a whole function using a function generator. In another embodiment, the wired logic portions are combined by cascading the long lines into the tristate inputs of another long line. In yet another embodiment, the long lines are cascaded into another line such as an edge decoder to form a logic function.

16 Claims, 9 Drawing Sheets

METHOD AND APPARATUS FOR CONNECTING LONG LINES TO FORM WIDE LOGIC FUNCTIONS

CROSS-REFERENCE TO RELATED APPLICATION

This application relates to the following commonly assigned, concurrently filed U.S. patent application: Ser. No. 09/018,275 [docket X-292-1 US] invented by Stephen M. Trimberger entitled "METHOD AND APPARATUS FOR CONNECTING LONG LINES TO FORM WIDE BUSSES", which is incorporated herein by reference.

BACKGROUND OF THE INVENTION

1. Field of the Invention

This invention relates to the field of digital electronics, and more particularly to digital logic implementations in programmable logic devices such as field programmable gate arrays (FPGAs).

2. Description of the Background Art

In the construction of electronic circuits, many designers use programmable logic devices such as FPGAs to implement digital circuit designs. One commonly-known FPGA is the Xilinx XC4000™ Series device, which is described on pages 4-5 through 4-78 of the Xilinx 1996 Data Book entitled "The Programmable Logic Data Book" (hereinafter referred to as "the Xilinx Data Book"), published September, 1996, available from Xilinx, Inc., 2100 Logic Drive, San Jose, Calif. 95124, which are incorporated herein by reference. (Xilinx, Inc., owner of the copyright, has no objection to copying these and other pages referenced herein but otherwise reserves all copyright rights whatsoever.)

Using a programmable logic device can reduce the amount of time between the conception of a circuit design and the production of a working circuit prototype, as well as facilitating later design changes. However, the utility of a programmable logic device for implementing large and/or complex logic functions may be limited by a lack of appropriate logic circuitry. Specifically, the number of drivers that may be supported on a single line or bus is typically limited by a fixed number of tristate buffers in the device architecture. This problem may be more clearly understood with reference to FIG. 1, which shows a simplified version of the Xilinx XC4000 Series FPGA architecture.

An FPGA typically comprises programmable logic blocks and programmable interconnect mechanisms for interconnecting the blocks. The FPGA of FIG. 1 includes a central array of Configurable Logic Blocks (CLBs) comprising function generators, registers, and so forth, surrounded by a ring of Input/Output Blocks (IOBs). Programmable interconnect lines of various lengths (not shown except for horizonal long lines) provide interconnections between the various CLBs and IOBs. Horizontal long lines are provided that span the device between the rows of CLBs. Each long line is accessible both from each CLB in the associated row and from the IOBs situated at each end of the row. Each row of CLBs has two associated long lines, one above and one below the row of CLBs. The long line drivers are implemented using tristate buffers, shown as diamond shapes in FIG. 1. The long lines are commonly used to implement busses in the FPGA, and the number of drivers on the bus is therefore limited by the number of tristate buffers along the horizontal long line. In the FPGA of FIG. 1, the maximum number of drivers on a long line is equal to the number of CLBs in the row plus two for the IOBs.

The tristate buffers are more clearly shown in FIG. 2, which is a detailed block diagram of a single row of CLBs and associated long lines from the FPGA architecture of FIG. 1. (An FPGA typically comprises many more than four CLBs per row, but only four are shown in the figures herein in order to simplify the drawings.) Each tristate buffer (206–213) has a data input, a tristate input (T206–T213), and an output that drives a long line (200, 201). Each tristate buffer is programmable and may assume any of several states, as described on pages 4-29 to 4-30 of the Xilinx Data Book. To avoid contention on long line 200, only one tristate buffer on each long line should be enabled at a given time.

In FIG. 2, CLBs 202, 203, 204, 205 are coupled to long line 200 via tristate buffers 206, 207, 208, 209, respectively. CLBs 202, 203, 204, 205 are further coupled to long line 201 via tristate buffers 210, 211, 212, 213, respectively.

When implementing a bus having a plurality of signal lines (bit lines), typically one long line is used for each bit line. In the circuit of FIG. 2, for example, long lines 200 and 201 can be configured to implement a two-bit bus with four bus drivers, wherein long line 200 carries a first bit and long line 201 carries a second bit of the bus signal.

In summary, in the FPGA of FIGS. 1 and 2, as well as in other programmable logic devices, the number of tristate buffers associated with any one long line is fixed, placing a maximum on the number of drivers that can drive each long line. The utility of the device in applications having a large number of drivers driving a common line or bus is diminished once this tristate buffer limit is reached. No mechanism is provided in the prior art for implementing tristate buffer driven lines having an arbitrarily large number of driver inputs.

A related problem is the implementation of functions with a large numbers of inputs ("wide logic functions"). While logic functions are typically implemented in CLBs, the number of inputs is limited. For example, functions with up to nine inputs can be supported by a single Xilinx XC4000 Series CLB. To calculate functions with more than nine inputs, additional CLBs must be used and cascaded together. This cascading introduces additional block delays into the circuit. Another disadvantage to using CLBs to implement wide logic functions is that all of the inputs must be brought to the CLBs, introducing interconnect delay and producing interconnect congestion that can make the resulting circuit unroutable. Therefore, it is commonly known to use long lines to implement wide functions, using a technique known as "wired logic", or "wired AND functions". (Such logic, for example, is shown and discussed in pages 3-5 through 3-11 of the Xilinx Data Book, which pages are incorporated herein by reference.) However, the number of inputs to a wired logic function is limited by the number of tristate buffers along the long line. It is desirable to provide a structure for generating wide functions of an arbitrary width.

SUMMARY OF THE INVENTION

The present invention provides a method and apparatus for combining tristate buffers into wide logic functions and busses with a large number of drivers. The invention provides for an arbitrary number of drivers to be accommodated on a single line in a circuit wherein the number of tristate buffers coupled to the line is limited.

According to one aspect of the invention, a plurality of lines are used to support the required number of tristate buffers, and a multiplexing circuit is used to select the active line. Tristate control signals for the tristate buffers are utilized to generate the requisite multiplexer select signals.

In one embodiment, the multiplexing function and the select signal generation logic are implemented in one or more CLBs. In another embodiment, wired logic functions perform the select signal generation, and a cascade configuration of tristate buffer driven lines performs the multiplexing function.

According to another aspect of the invention, a plurality of long lines are used to implement wired logic functions, and the lines are then combined to implement wired logic functions wider than can be accommodated by a single long line. In one embodiment, each of the long lines is coupled to an input of a CLB to combine the portions of the logic function into a whole function using a function generator. In another embodiment, the wired logic portions are combined by cascading the long lines into the tristate inputs of another long line. In yet another embodiment, the long lines are cascaded into another line such as an edge decoder to form a logic function.

BRIEF DESCRIPTION OF THE DRAWINGS

The present invention is illustrated by way of example, and not by way of limitation, in the following figures, in which like reference numerals refer to similar elements.

DETAILED DESCRIPTION OF THE DRAWINGS

A method and apparatus is described for combining tristate buffers into wide logic functions and busses with a large number of drivers. In the following description, numerous specific details are set forth to provide a more thorough description of the present invention. It will be apparent, however, to one skilled in the art that the present invention may be practiced without these specific details. In other instances, well known features have not been described in detail so as not to obscure the present invention.

First Embodiment

Figure 1:
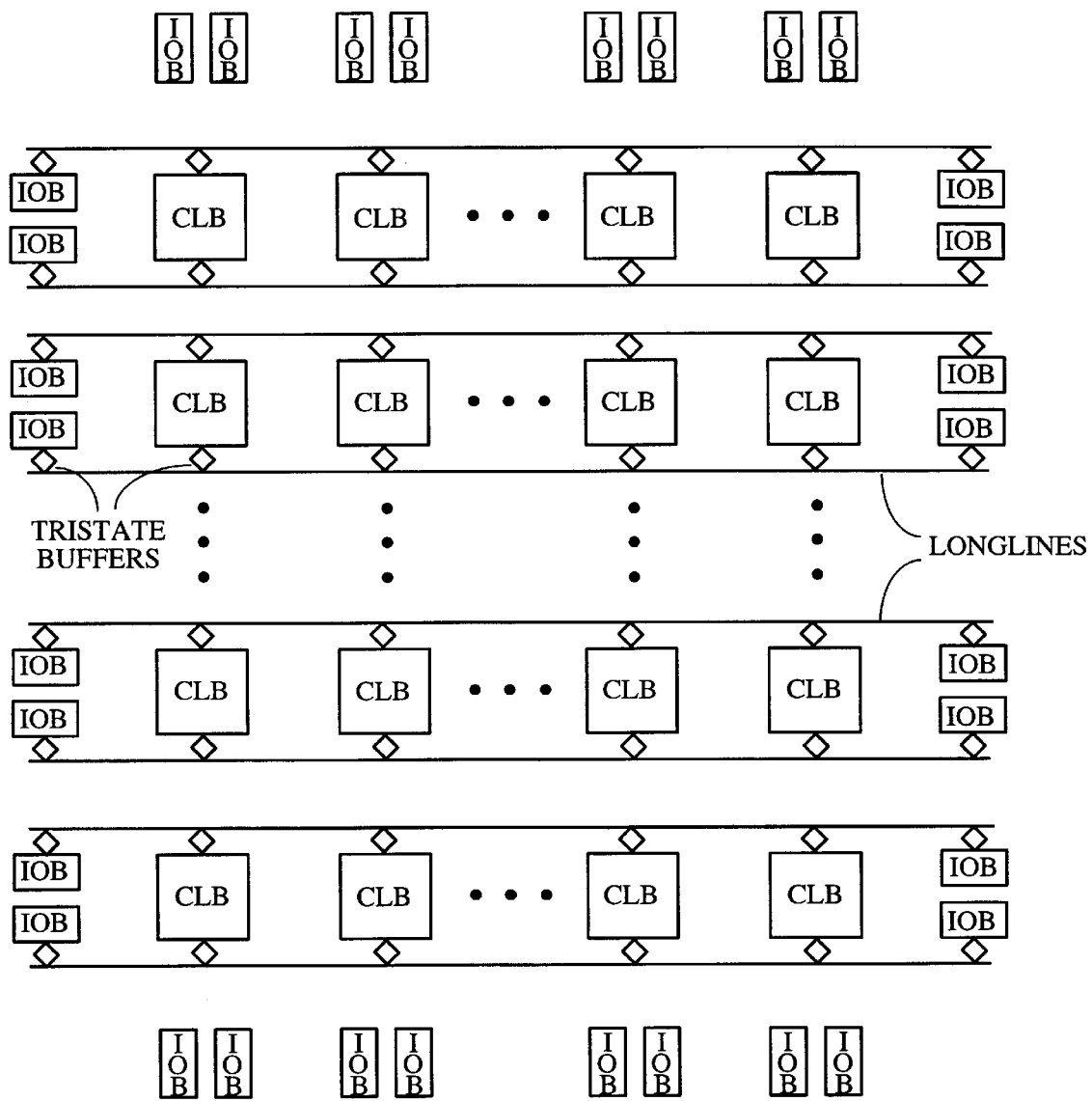
FIG. 1 is a block diagram illustrating a prior art FPGA architecture.
Figure 2:
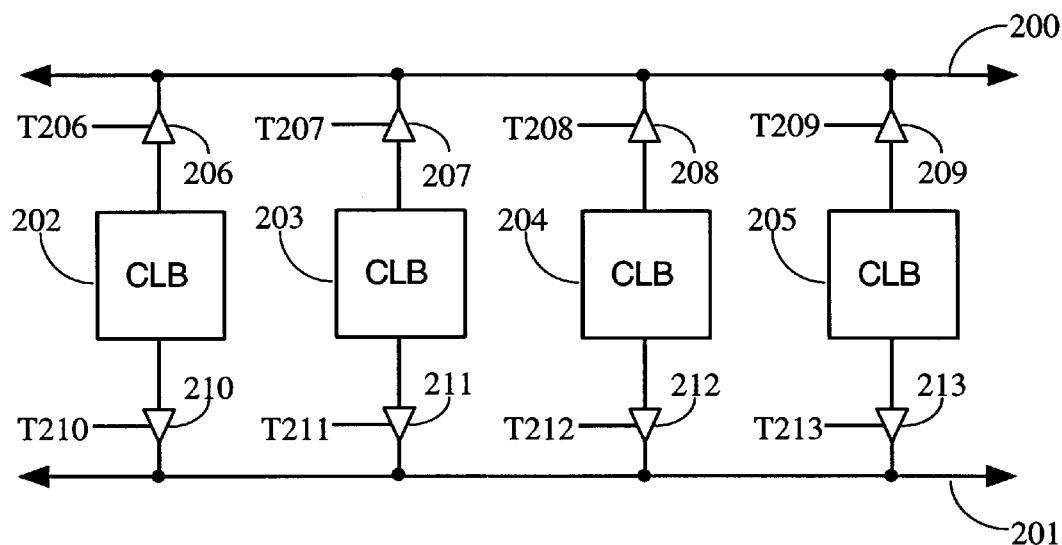
FIG. 2 is a block diagram of a row of CLBs and associated long lines coupled via tristate buffers in the FPGA architecture of FIG. 1.
Figure 3:
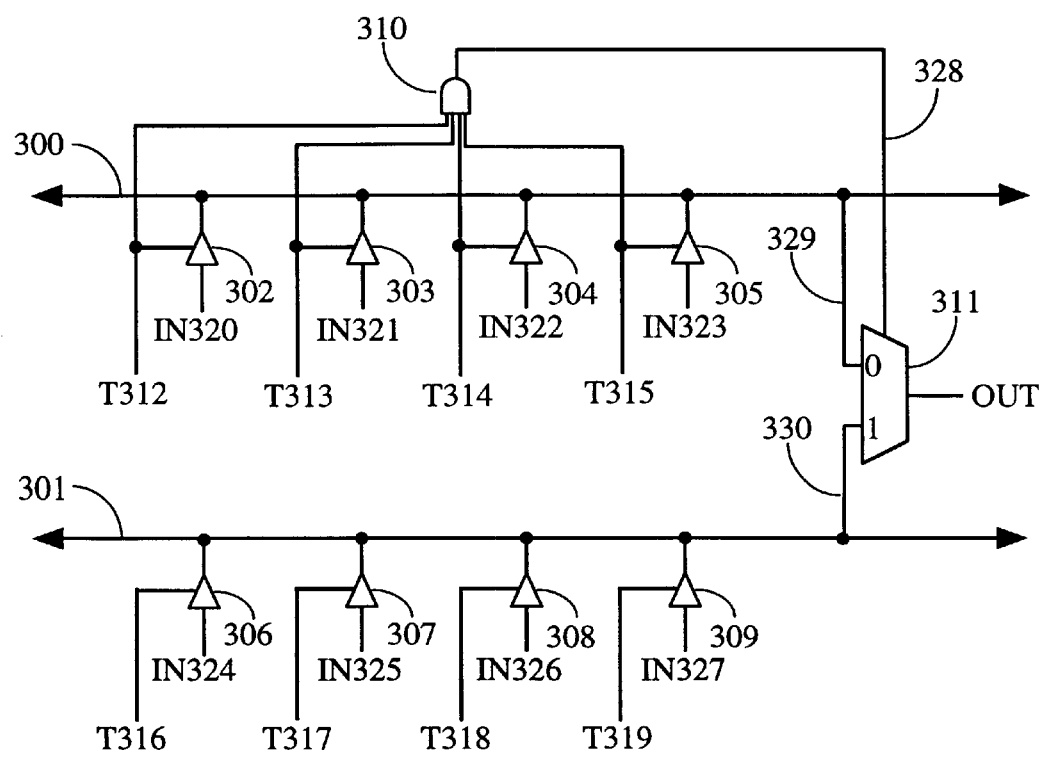
FIG. 3 is a circuit diagram of a tristate buffer driven line comprising two long lines.

FIG. 3 is a circuit diagram of a circuit combining two long lines and associated tristate buffers to create a tristate buffer driven line with twice as many possible drivers as in prior art schemes. The circuit of FIG. 3 comprises long lines 300 and 301, 4-input AND gate 310, multiplexer 311, and tristate buffers 302–309. The outputs of tristate buffers 302–305 are coupled to long line 300, and the outputs of tristate buffers 306–309 are coupled to long line 301. Tristate control inputs T312, T313, T314, T315 of tristate buffers 302, 303, 304, 305, respectively, are each coupled to an input of AND gate 310. Output signal 328 from AND gate 310 is coupled to the control input of multiplexer 311. Input signals IN320, IN321, IN322, IN323 drive tristate buffers 302, 303, 304, 305, respectively.

Tristate control signals T316, T317, T318, T319 are the control inputs of tristate buffers 306, 307, 308, 309, respectively. Input signals IN324, IN325, IN326, IN327 drive tristate buffers 306, 307, 308, 309, respectively. Long line 300 is coupled to the "0" input of multiplexer 311 via interconnect 329. Long line 301 is coupled to the "1" input of multiplexer 311 via interconnect 330.

Tristate buffers 302–309 are in the high impedance state when the respective tristate control signals are high, and are in buffer drive mode when the respective tristate control signals are low. The apparatus of FIG. 3 may also be applied to tristate buffers that are in the high impedance mode when the tristate control input is low, and are in a buffer drive mode when the control input is high. For this alternate embodiment, AND gate 310 may be replaced with a NOR gate, or the inputs of multiplexer 311 may be switched and AND gate 310 replaced with an OR gate.

In the embodiment of FIG. 3, typically at most one of tristate buffers 302–309 is driving long line 300 or 301 during any given time interval. Therefore, either all tristate control inputs T312–T319 are high, or one of the tristate control inputs is low. If one of tristate buffers 306–309 is driving long line 301, then one of tristate control signals T316–T319 is low, and as only one tristate control signal may be low, tristate control signals T312–T315 are all high. Therefore, select signal 328 from AND gate 310 is high, and selects the "1" input of multiplexer 311. Thus, long line 301 is coupled via interconnect 330 and multiplexer 311 to drive the multiplexer output line (OUT).

In the instance where one of tristate buffers 302–305 is driving long line 300, the respective tristate control signal from signals T312–T315 is low. Therefore, select signal 328 from AND gate 310 is also low, so multiplexer 311 selects the "0" input. Thus, when one of tristate buffers 302–305 is in buffer drive mode, long line 300 drives the multiplexer output line (OUT) via interconnect 329 and multiplexer 311.

With the circuit as shown, when all the tristate buffers associated with long line 300 are in the high impedance state, multiplexer 311 defaults to selection of long line 301. This default mechanism allows for selection of long line 301 without the need for generating a control signal to multiplexer 311 based on tristate control signals T316–T319. The multiplexer output line (OUT) is driven from the long line having an active driver, i.e., from the long line wherein one tristate buffer is in buffer drive mode. Select signal 328 determines which long line should be selected by multiplexer 311 based on the tristate control signals of one long line. The number of possible drivers for output line OUT is thus increased beyond the number of tristate buffers associated with a single long line, and the limitations of the prior art are overcome.

Second Embodiment

Figure 4:
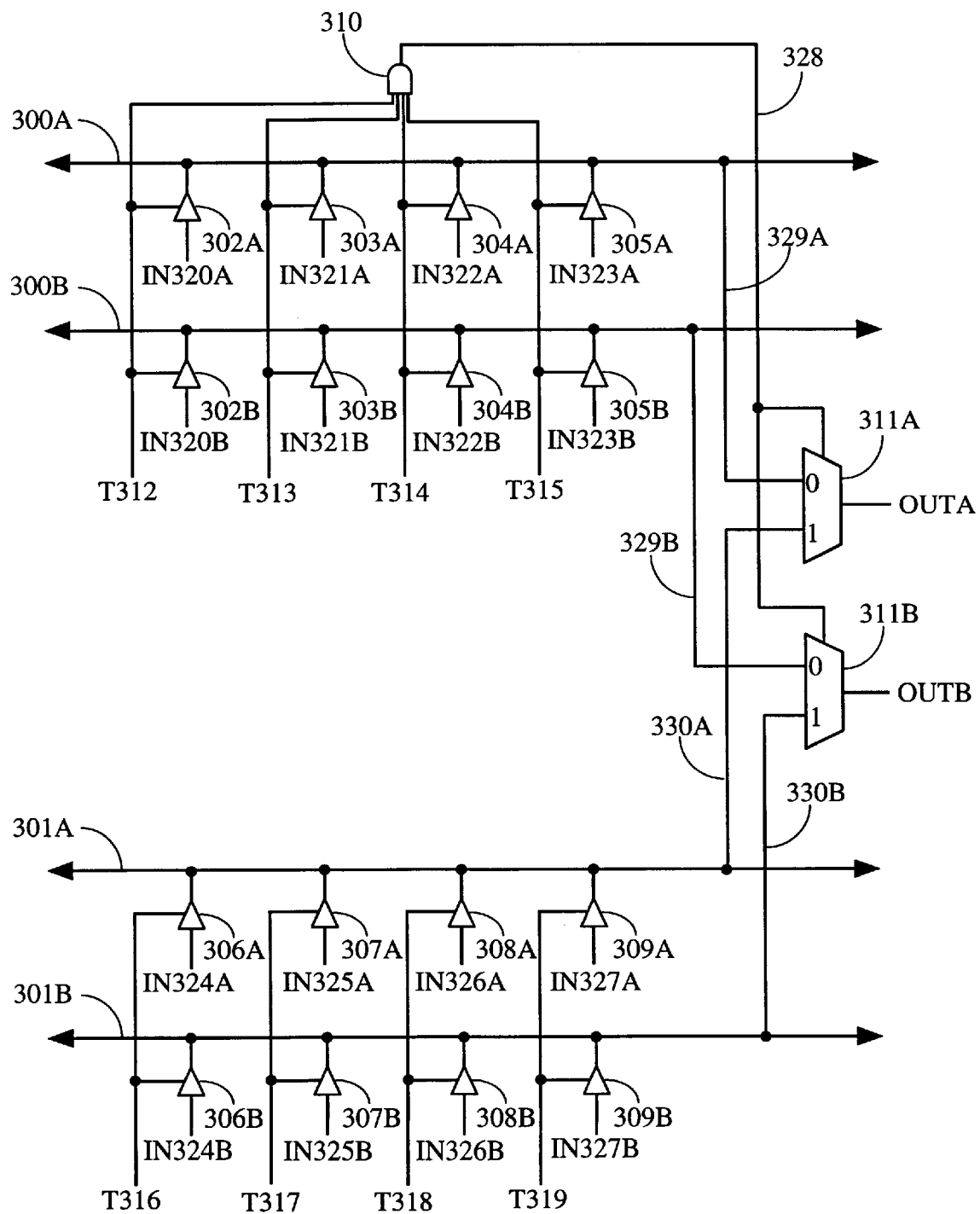
FIG. 4 is a circuit diagram of a two-bit tristate buffer driven bus comprising two long lines per bit.

FIG. 4 is a circuit diagram illustrating an expansion of the apparatus of FIG. 3 to multi-bit schemes such as busses. The embodiment of FIG. 4 provides for the driving of two bit lines (OUTA, OUTB), but may be easily extended to three or more bit lines. The apparatus of FIG. 4 comprises long lines 300A and 300B, long lines 301A and 301B, tristate buffers 302A–309A, tristate buffers 302B–309B, multiplexers 311A and 311B, and AND gate 310.

The circuit of FIG. 4 is substantially a parallel implementation of the circuit of FIG. 3, but illustrates the need for only one multiplexer select signal regardless of the number of bits being driven on the bus.

The circuitry for each of bits A and B corresponds to that of the single bit in the embodiment of FIG. 3. Tristate control signals T312–T315 drive tristate buffers 302A–305A, respectively, and also drive tristate buffers 302B–305B, respectively. Tristate control signals T312–T315 are also provided as inputs to AND gate 310, which generates multiplexer select signal 328. Tristate control signals T316–T319 drive tristate buffers 306A–309A, respectively, and also drive tristate buffers 306B–309B, respectively.

Long line 300A is coupled to the "0" input of multiplexer 311A via interconnect 329A, and long line 300B is coupled to the "0" input of multiplexer 311B via interconnect 329B. Long line 301A is coupled to the "1" input of multiplexer 311A via interconnect 330A, and long line 301B is coupled to the "1" input of multiplexer 311B via interconnect 330B. Select signal 328 is provided as a control signal for both of multiplexers 311A and 311B. Multiplexer 311A output line OUTA represents the drive output for bit A from either long line 300A or 301A. Multiplexer 311B output line OUTB represents the drive output for bit B from either long line 300B or 301B.

In the circuit of FIG. 4, typically only one pair of tristate buffers (e.g., 302A and 302B, or 308A and 308B, etc.) are driving their respective long lines at a given time. Because each pair of tristate buffers is controlled by a single tristate control signal, no extra select signal generation circuitry is needed for the additional bit. As in the circuit of FIG. 3, the default drive signals for multiplexer outputs OUTA and OUTB are selected from long lines 301A and 301B, respectively.

Additional bits can easily be added to the bus by adding additional long lines and an additional multiplexer for each additional bit. Each multiplexer is controlled by the same select input.

Third Embodiment

Another modification that can be made to the circuit of FIG. 3 is the expansion of the circuit to include more than two long lines. Such an expansion is useful, for example, in implementing a bus with a large number of drivers, where the number of tristate buffers on two long lines is insufficient.

Figure 5:
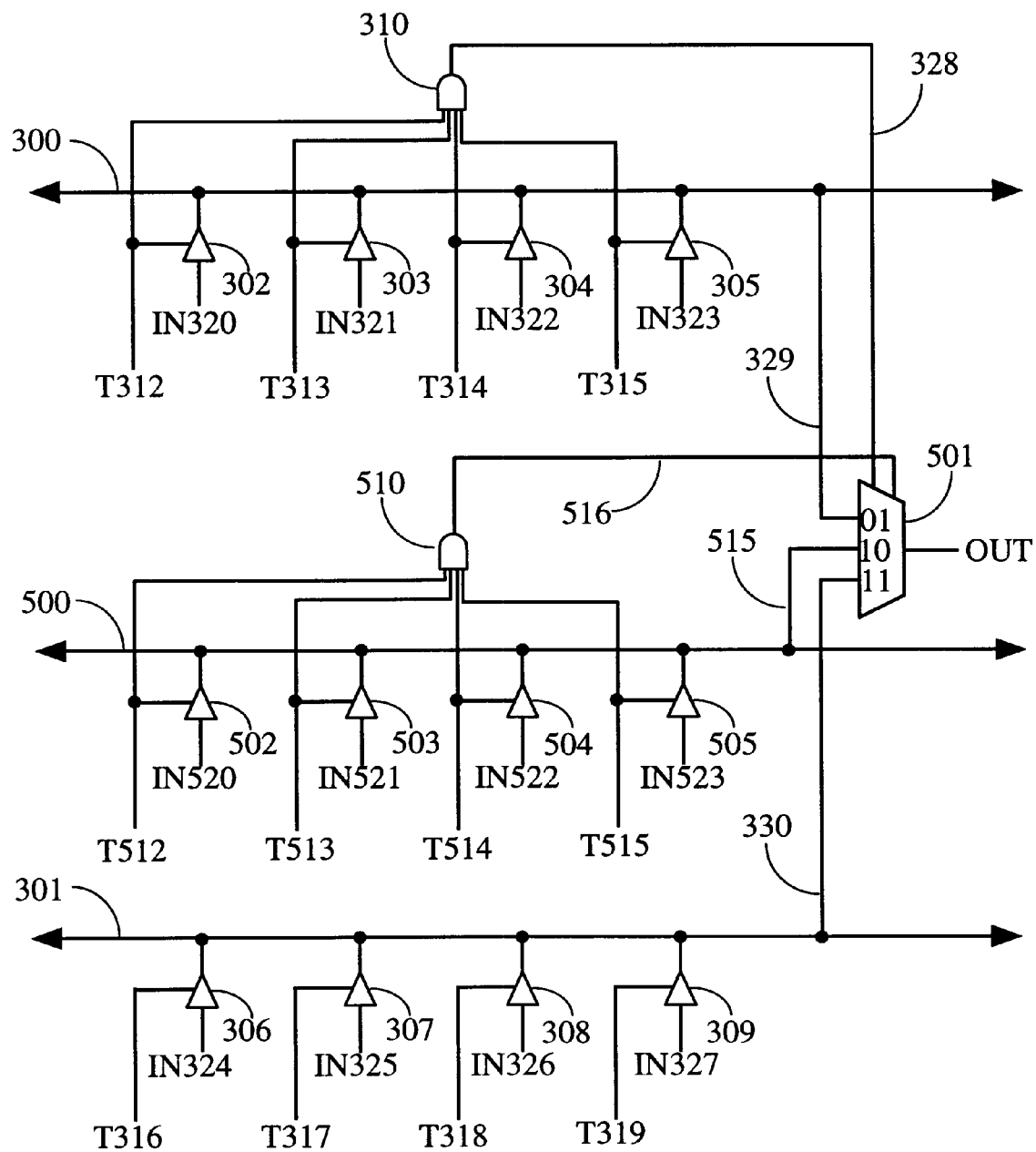
FIG. 5 is a circuit diagram of a tristate buffer driven line comprising three long lines.

FIG. 5 is a circuit diagram illustrating expansion of the circuit of FIG. 3 to include further long lines with associated tristate buffers for driving a single output. The circuit of FIG. 5 comprises long line 300 with associated tristate buffers 302–305, long line 301 with associated tristate buffers 306–309, long line 500 with associated tristate buffers 502–505, AND gates 310, 510, and three-to-one multiplexer 501.

Long line 300 and tristate buffers 302–305 are coupled together as shown in FIG. 3. Tristate control signals T312–T315 are provided as inputs to AND gate 310. Select signal 328 from AND gate 310 is provided as a first select input to multiplexer 501. Long line 300 is coupled to the "01" input of multiplexer 501 via interconnect 329.

Long line 301 and tristate buffers 306–309 are coupled together as shown in FIG. 3. Long line 301 is coupled to the "11" input of multiplexer 501 via interconnect 330.

The outputs of tristate buffers 502–505 are coupled to long line 500. Input signals IN520, IN521, IN522, IN523 drive the inputs of tristate buffers 502, 503, 504, 505, respectively. Tristate control signals T512, T513, T514, T515 drive the tristate control inputs of tristate buffers 502, 503, 504, 505, respectively. Further, tristate control signals T512–T515 are provided as inputs to 4-input AND gate 510. Select signal 516 is provided by AND gate 510 as a second select signal for multiplexer 501. Long line 500 is coupled to the "10" input of multiplexer 501 via interconnect 515.

When one of tristate buffers 302–305 is driving long line 300, then the respective one of control signals T312–T315 is low, causing the first multiplexer select signal 328 to also be low. Multiplexer 501 thus selects long line 300 to drive multiplexer output line OUT. Similarly, if one of tristate buffers 502–505 is driving long line 500, then the respective one of control signals T512–T515 is low, causing the second multiplexer select signal 516 to be low. Thus, multiplexer 501 selects long line 500 to drive output line OUT.

If none of tristate buffers 302–305 and 502–505 are driving long line 300 and 500, then AND gates 310 and 510 both output high signals and multiplexer 501 selects long line 301 by default to drive output line OUT. As only one tristate buffer is permitted to drive the circuit output at any given time, the "00" combination for multiplexer 501 is not allowed.

In another embodiment, the multiplexer select signal on interconnect 329 is supplied as the "00" input to multiplexer 501, so output line OUT has a known value when inputs are in conflict.

As shown in FIG. 5, each additional long line and associated tristate buffers added to the circuit requires an additional AND gate for generation of a select signal. However, one long line in the circuit may still be designated as a default output driver, thereby requiring no select signal generating circuit. Hence, arbitrarily large tristatable output lines are possible. In embodiments with multiplexer circuits having large numbers of inputs, some conditioning or decoding of the select signals generated from the AND gates may be performed for efficiency.

The AND gates and multiplexers of FIGS. 3–5 may be implemented in CLBs within the FPGA. However, in other embodiments, when supported by the FPGA, the AND gates may be implemented using wired AND functions with further long lines. Also, the multiplexing function may be implemented by using an additional long line for the multiplexer. FIGS. 6–9 and their related descriptions provide background information regarding the implementation of wide logic functions using wired logic circuits. This background information is useful in understanding FIG. 10, which shows an embodiment of the invention wherein long lines are used both for select signal generation and for multiplexing circuitry.

Wired Logic AND Functions

In wired logic circuits, which are well known in the art, the output signals of several tristate buffers are joined at a single line node to form a single wired logic function. The line node to which the individual tristate buffers are coupled has an inherent logic value that may be overridden by one or more of the individual tristate buffers. In FPGAs, the line node is typically implemented as a long line, which is resistively coupled to a high voltage supply (VCC), and the individual tristate buffers are designed to provide a low impedance path between the line node and ground (GND) when the respective tristate buffer input is low (or high). By providing the tristate buffers with open-drain (open-collector for bipolar logic) configurability, wired logic functions can be carried out using open-drain tristate buffers and the associated long line.

Figure 6:
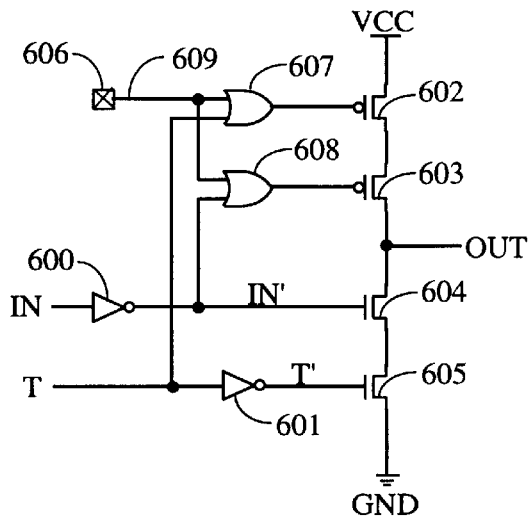
FIG. 6 is a circuit diagram of a prior art SRAM-configurable CMOS tristate buffer.

FIG. 6 is a circuit diagram of an FPGA tristate buffer implemented using CMOS technology. The tristate buffer comprises inverters 600, 601; PMOS transistors 602, 603; NMOS transistors 604, 605; OR gates 607, 608; and SRAM configuration memory cell 606. The source of transistor 602 is coupled to the high supply voltage (VCC). The drain of transistor 602 is coupled to the source of transistor 603, and the drain of transistor 603 is coupled to the drain of transistor 604 to form output node OUT. The source of transistor 604 is coupled to the drain of transistor 605, and the source of transistor 605 is coupled to the low voltage supply (GND).

Buffer input signal IN is provided to inverter 600 to generate inverted input signal IN'. Inverted input signal IN' is provided to one input of OR gate 608 and to the gate of transistor 604. Control input T is provided to one input of OR gate 607, and to inverter 601 to generate inverted control signal T'. Control signal T' is provided to the gate of transistor 605. The programmed configuration control value stored in SRAM memory cell 606 is provided to OR gates 607 and 608. OR gates 607, 608 drive the gates of transistors 602, 603, respectively.

When a "0" is programmed into memory cell 606, the circuit of FIG. 6 is set for normal operation as a tristate buffer. In normal operation, the outputs of OR gates 607 and 608 match their respective T and IN' signal values. When a "1" is programmed into memory cell 606, the circuit is set for open-drain operation. In open-drain operation, the outputs of OR gates 607 and 608 are always "1", thus placing transistors 602 and 603 into a high impedance mode.

In normal operation, the circuit of FIG. 6 behaves as follows. When control signal T is high, transistors 602 and 605 are in a high impedance state, thereby preventing the low impedance coupling of the output node to either voltage supply. In this state, the tristate buffer presents a high impedance output, with the input signal disabled from driving the output. When the control signal T is low, transistors 602 and 605 are in a low impedance state, thereby permitting transistors 603 and 604 to drive the output node as an inverter. The inversion of the input signal by transistors 603 and 604 is compensated for by inverter 600, therefore the output signal OUT is equivalent to the input signal IN in this state.

By setting the memory cell value to "1", the circuit of FIG. 6 is transformed into an open-drain tristate buffer (corresponding to the circuit of FIG. 7) that is suitable for use as an input gate for wired logic circuits. Transistors 602, 603 are effectively removed from the operation of the tristate buffer by the coupling of the gate inputs of transistors 602, 603 to VCC via OR gates 607, 608. Their removal prevents any low impedance coupling of output node OUT with VCC.

Figure 7:
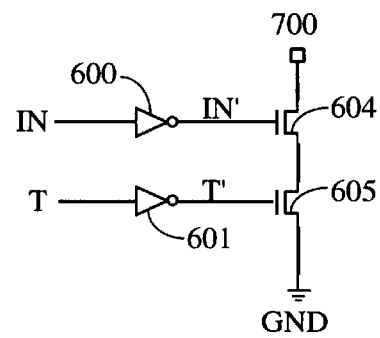
FIG. 7 is a circuit diagram of a prior art CMOS tristate buffer configured as an open-drain tristate buffer.

In FIG. 7, the output node is labeled as element 700, formed by the open drain of transistor 604. In operation, the circuit of FIG. 7 presents a high impedance at output node 700 when either of control signal T and input signal IN is high. When both input signal IN and control signal T are low, transistors 604 and 605 form a low impedance path between node 700 and ground.

By coupling node 700 to a long line having a pull-up resistor, an OR function can be implemented using both input signal IN and control signal T as logic inputs, or an AND function can be implemented with open-drain tristate buffers having IN and T inputs coupled together, the buffers being coupled in parallel to a long line.

Figure 8:
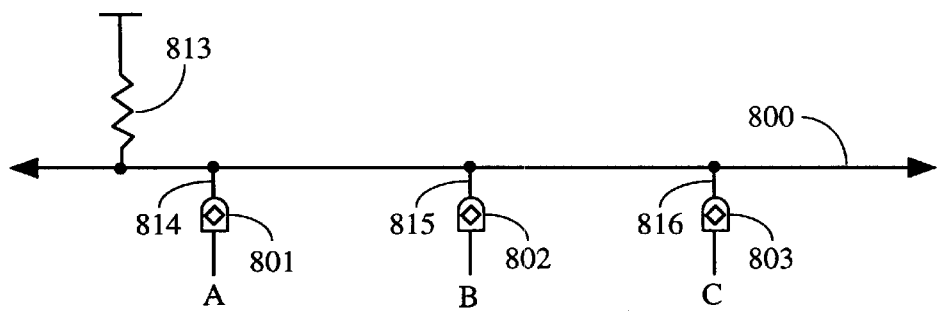
FIG. 8 is a block diagram of a prior art wired logic function using tristate buffers and long lines.

FIG. 8 is a block diagram of a wired AND logic function implemented with one long line and three open-drain tristate buffers. Long line 800 is coupled to VCC via pull-up resistor 813. Pull-up resistor 813 may, for example, be implemented with an NMOS transistor having its gate tied to VCC or with a PMOS transistor having its gate tied to ground. The current sourcing ability of pull-up resistor 813 is designed to be weak relative to the current sinking ability of any single tristate buffer coupled to the long line, to permit the tristate buffers to pull the long line to a low logic value.

Open-drain tristate buffers 801, 802, 803 (each represented by an AND symbol containing a diamond) are coupled to long line 800 via open-drains 814, 815, 816, respectively. The input signals of open-drain tristate buffers 801, 802, 803 are logic signals A, B, C, respectively.

Due to the effects of pull-up resistor 813, long line 800 defaults to a high logic value in the absence of a low impedance path to ground from any one of tristate buffers 801-803. Therefore, because tristate buffers 801-803 present a high impedance if any one of the tristate buffer inputs is high, the logic value of long line 800 is high if logic inputs A, B, and C are high. The wired function thus provided is therefore equal to AND(A,B,C).

Figure 9:
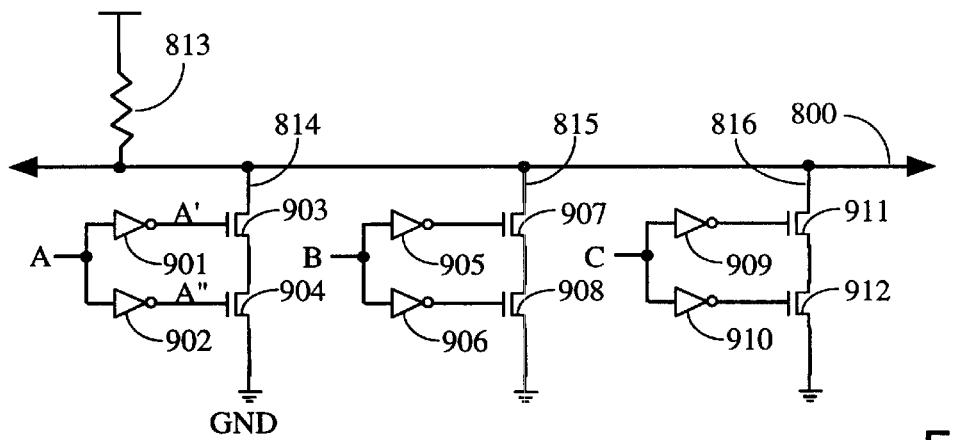
FIG. 9 is a circuit diagram of a prior art wired logic function using tristate buffers and long lines.

FIG. 9 is a more detailed circuit diagram of the wired logic of FIG. 8, illustrating the internal configurations of the tristate buffers. In FIG. 9, tristate buffer 801 of FIG. 8 comprises inverters 901, 902 and NMOS transistors 903, 904. Inverter 901 receives logic input A and provides inverted logic input A' to the gate of transistor 903. Inverter 902 also receives logic input A, and provides inverted logic input A" to the gate of transistor 904. The source of transistor 904 is coupled to ground, and the drain of transistor 904 is coupled to the source of transistor 903. The drain of transistor 903 provides the open-drain coupling 814 to long line 800.

Similarly, tristate buffer 802 of FIG. 8 comprises inverters 905, 906 and NMOS transistors 907, 908, and tristate buffer 803 of FIG. 8 comprises inverters 909, 910 and NMOS transistors 911, 912.

To provide the single logic signal inputs of tristate buffers 801-803, input signal IN and control input T of FIG. 7 are coupled together to receive the single logic signal input for the respective tristate buffer. Alternatively, tristate buffers 801-803 could have either the input signal IN or the control input T coupled to ground, with the remaining input receiving the logic input signal.

Because the wired AND is implemented with a horizontal long line such as is used to implement the tristatable output lines (e.g., lines 300, 301 of FIG. 3), the wired AND is equipped with the same number of inputs as are required by the tristate buffers of the output line. When applied to the circuits of the invention, therefore, the wired AND provides a convenient means for generating the select signal for individual output long lines. This approach leaves the CLBs of an FPGA available to be utilized for other purposes.

Fourth Embodiment

Figure 10:
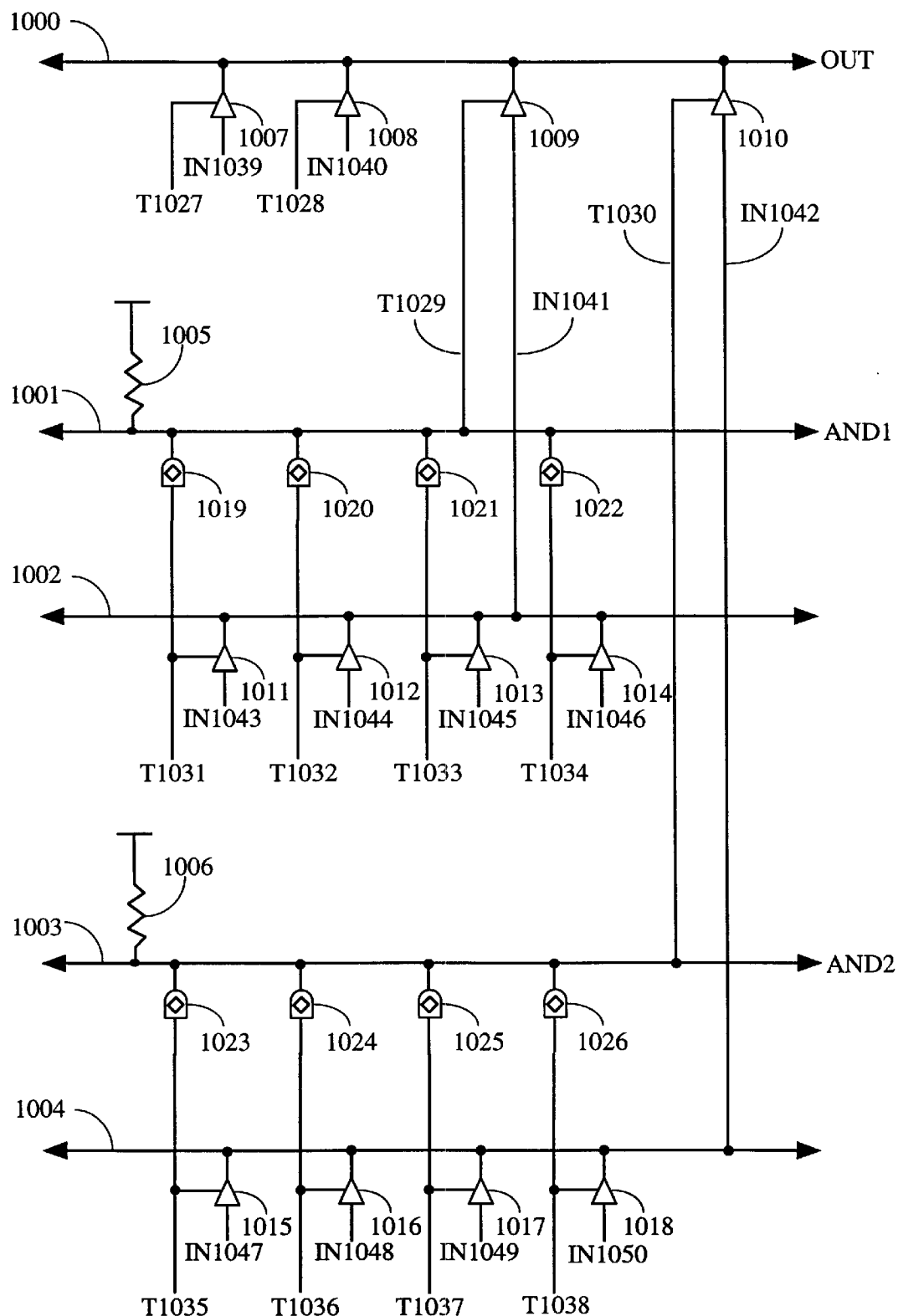
FIG. 10 is a block diagram of a tristate buffer driven line implemented with wired AND logic and an output multiplexer, where the output multiplexer comprises a long line.

An embodiment of the invention using wired logic circuits to generate the select signals is illustrated in FIG. 10. In the embodiment of FIG. 10, the multiplexing function is also implemented using wired logic, by using an additional long line for the multiplexer. In this case, each multiplexer input is an input of one of the tristate buffers associated with the additional long line. The respective select signals act as the tristate control inputs for these tristate buffers. By using a long line as the multiplexer, the output signal is automatically distributed across the logic device without additional interconnect delay.

Specifically, the circuit of FIG. 10 comprises long line 1000 and associated tristate buffers 1007-1010 (implementing the multiplexer), long line 1001 and associated open-drain tristate buffers 1019–1022 (implementing a first AND gate), long line 1002 and associated tristate buffers 1011–1014 (implementing the inputs associated with the first AND gate, AND1), long line 1003 and associated open-drain tristate buffers 1023–026 (implementing a second AND gate, AND2), and long line 1004 and associated tristate buffers 1015–1018 (implementing the inputs associated with the second AND gate).

Long lines 1001, 1003 are configured as wired AND logic circuits. Pullup resistors 1005, 1006 couple long lines 1001, 1003, respectively, to VCC. Tristate buffers 1019–1026 are configured with open drains to perform as wired AND input gates. The outputs of wired AND input gates 1019–1022 are coupled to long line 1001. The outputs of wired AND input gates 1023–1026 are coupled to long line 1003.

The outputs of tristate buffers 1011–1014 are coupled to long line 1002. Input signals IN1043, IN1044, IN1045, IN1046 drive the inputs of tristate buffers 1011, 1012, 1013, 1014, respectively. Tristate control signals T1031, T1032, T1033, T1034 drive the tristate control inputs of tristate buffers 1011, 1012, 1013, 1014, respectively. Further, tristate control signals T1031, T1032, T1033, T1034 are coupled to the inputs of wired AND input gates 1019, 1020, 1021, 1022, respectively.

The outputs of tristate buffers 1015–1018 are coupled to long line 1004. Input signals IN1047, IN1048, IN1049, IN1050 drive the inputs of tristate buffers 1015, 1016, 1017, 1018, respectively. Tristate control signals T1035, T1036, T1037, T1038 drive the tristate control inputs of tristate buffers 1015, 1016, 1017, 1018, respectively. Further, tristate control signals T1035, T1036, T1037, T1038 are coupled to the inputs of wired AND input gates 1023, 1024, 1025, 1026, respectively.

The outputs of tristate buffers 1007–1010 are coupled to long line 1000. Input signals IN1039, IN1040, IN1041, IN1042 drive the inputs of tristate buffers 1007, 1008, 1009, 1010, respectively. Input signals IN1041, IN1042 are coupled to long lines 1002, 1004, respectively. Tristate control signals T1027, T1028, T1029, T1030 drive the tristate control inputs of tristate buffers 1007, 1008, 1009, 1010, respectively. Tristate control signals T1029 and T1030 are coupled to long lines 1001 and 1003, respectively.

The wired AND circuit formed by long line 1001 and open drain tristate buffers 1019–1022 acts as the AND gate (AND1) for generating the select signal for coupling long line 1002 to long line 1000 via tristate buffer 1009. The wired AND circuit formed by long line 1003 and open drain tristate buffers 1023–1026 act as the AND gate (AND2) for generating the select signal for coupling long line 1004 to long line 1000 via tristate buffer 1010. Tristate buffers 1009, 1010 therefore act as the multiplexer for selecting the output to drive long line 1000. The signal on long line 1000 corresponds to the multiplexer output signal OUT of other embodiments.

Tristate buffers 1007, 1008 can be used to add additional long lines (or additional single inputs) to the multiplexer, as desired. The circuit of FIG. 10 can also be expanded to provide multiple bit lines, as described with respect to FIG. 4. Therefore, an arbitrary number of drivers and bit lines are possible.

Other Wired Logic Functions

Figure 11:
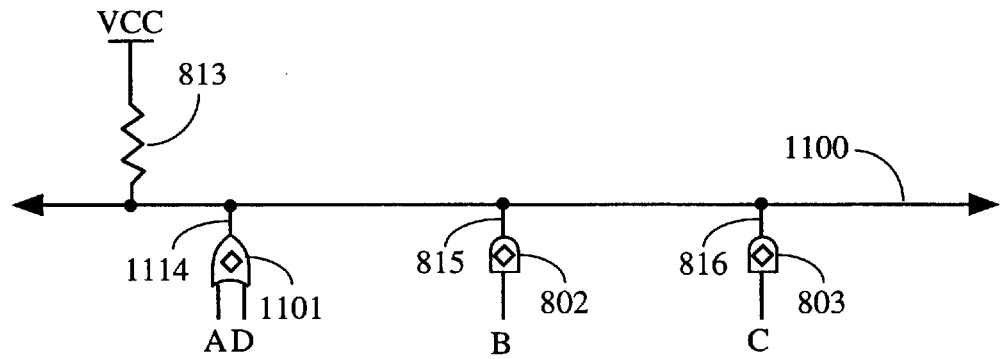
FIG. 11 is a block diagram of a prior art OR-AND wired logic function implemented using tristate buffers and a long line.

Wired logic functions are not limited to simple AND functions. For example, FIG. 11 shows a prior art OR-AND wired logic function implemented using tristate buffers and a long line. FIG. 11 resembles FIG. 8 except that open-drain tristate buffer 801 is replaced by open-drain tristate buffer 1101, which implements an open-drain OR-gate (represented by an OR symbol containing a diamond) with two inputs, A and D. This OR function can be implemented, for example, by using the open-drain tristate buffer of FIG. 7, with A and D of FIG. 11 as the two inputs IN and T of FIG. 7. Tristate buffer 1101 is coupled to long line 1100 via open-drain 1114, and thereby pulls long line 1100 low whenever both A and D are low.

Due to the effects of pullup resistor 813, long line 1100 defaults to VCC in the absence of a low impedance path to ground from any one of tristate buffers 1101, 802, 803. Therefore, because tristate buffers 1101, 802, 803 each present a high impedance if any one of their inputs is high, the logic value of long line 1100 is high if logic input B is high, logic input C is high, and either logic input A or logic input D is high. The wired logic function provided on long line 1100 is therefore equal to (A+D)BC.

From the example of FIG. 11, it is seen that wired logic functions have some versatility with respect to the logic implemented, as well as allowing a larger number of inputs than is normally available using standard logic gates or function generators. Wired logic is particularly useful in such applications as address decoding. However, as earlier discussed, the utility of the wired logic is limited by the number of tristate buffers on a single long line. Typically, there are about 10–40 CLBs in a row and therefore about 12–42 tristate buffers on a long line. The wired AND logic provided by a single long line and the associated tristate buffers is therefore insufficient to decode a 64-bit address.

A second aspect of the present invention allows a plurality of long lines to be used to implement a single wired logic function.

Fifth Embodiment

Figure 12:
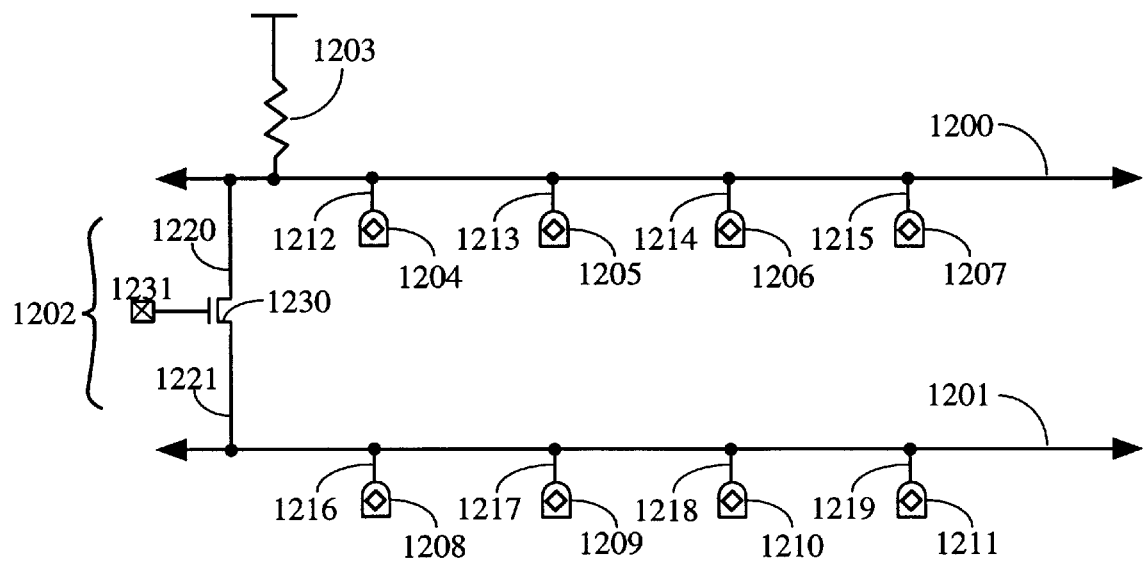
FIG. 12 is a block diagram of a wide wired logic function implemented using tristate buffers and two long lines coupled together.

FIG. 12 is a block diagram of a wide wired logic function formed from two long lines and associated tristate buffers. Long line 1200 is coupled via pullup resistor 1203 to VCC. Open-drain tristate buffers 1204, 1205, 1206, 1207 are coupled to long line 1200 via open-drains 1212, 1213, 1214, 1215, respectively. Similarly, tristate buffers 1208, 1209, 1210, 1211 are coupled to long 1201 via open-drains 1216, 1217, 1218, 1219, respectively. Long line 1200 is coupled to long line 1201 via bidirectional interconnect 1202. Bidirectional interconnect 1202 may, for example, be implemented as two interconnect lines 1220, 1221 coupled to long lines 1200, 1201, respectively, and connected by a programmable pass transistor 1230 controlled by a programmable memory cell 1231.

The circuit of FIG. 12 provides a larger number of wired AND inputs than would be the case if a single long line were used. However, the load presented by the parasitic drain capacitance of each tristate buffer, as well as the parasitic capacitance and resistance associated with the full length of each long line and the bidirectional interconnect, greatly increase the rise time and fall time of the combined long line voltage. Therefore, the maximum frequency at which the circuit of FIG. 12 can operate is much lower than the maximum frequency of a single long line wired AND function.

Further, the parasitic resistance of the long lines can give rise to voltage differences at various points on each long line, depending on the distribution of pullup resistors and the location of the tristate buffer or buffers in the low impedance state. In addition, because the tristate buffers are not designed to drive the increased load, the voltage level of a logic low output may be higher than desired, resulting in reduced noise immunity. If more than two long lines are combined as shown in FIG. 12, these undesirable effects are increased.

Sixth Embodiment

Figure 13:
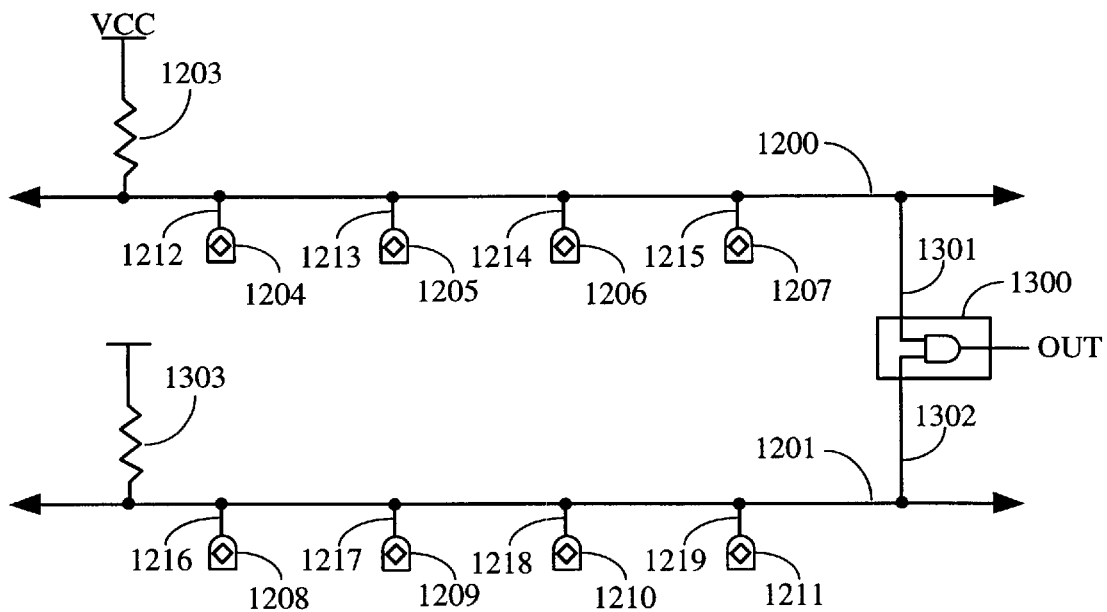
FIG. 13 is a block diagram of a wide wired logic function implemented using tristate buffers, two long lines, and a CLB.

FIG. 13 is a block diagram of a wide wired logic function, implemented with two long lines and a CLB, that overcomes the drawbacks of the circuit of FIG. 12. The circuit resembles that of FIG. 12, except that long line 1201 is coupled via pullup resistor 1303 to VCC and long lines 1200, 1201 are not coupled together. Instead, the circuit comprises CLB 1300 having two inputs 1301, 1302. CLB inputs 1301, 1302 are coupled to long lines 1200, 1201, respectively. CLB 1300 implements (e.g., in a function generator) a logical AND function of inputs 1301, 1302 and generates output OUT, which corresponds to the AND function of all tristate buffer inputs.

In the embodiment of FIG. 13, the tristate buffers are not required to drive a plurality of long lines, but need only drive the one long line to which they are directly coupled, as they are designed to do. Each long line carries out one portion of the AND function, and the separate portions are combined in a CLB. The circuit of FIG. 13 can therefore be expanded by including additional long lines interconnected with CLB 1300, similarly to the interconnection of long lines 1200, 1201. There is no extra delay incurred from adding long lines in this manner, since the wired AND portions are performed in parallel. Thus, AND functions can be provided for applications such as large address decoding. Other functions may be implemented by configuring the CLB as something other than an AND gate (e.g., an OR gate, etc.).

Figure 14:
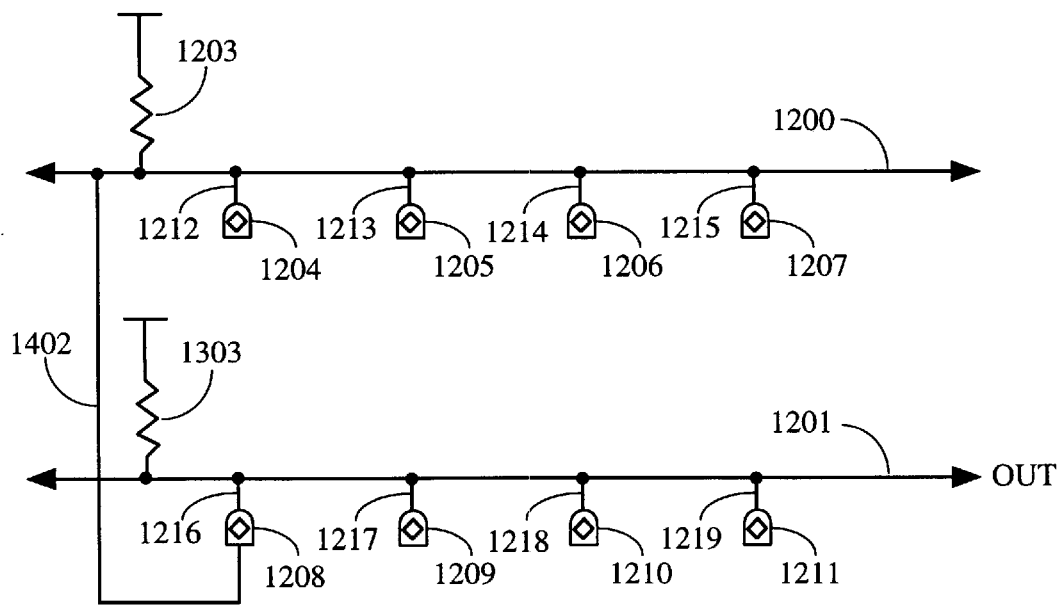
FIG. 14 is a block diagram of another embodiment of the invention implementing a wide wired logic function using tristate buffers and two cascaded long lines.

The propagation delay ($T_{PROP}$) for the circuit of FIG. 13 is equal to:

$$T_{PROP}=T_{PUF}+T_{IC}+T_{ILO}$$

where TPUF represents the delay of the pullup resistor of one of the long lines, $T_{IC}$ is the delay of the interconnect between the long lines and CLB 1300, and $T_{ILO}$ represents the delay of the combining logic of CLB 1300. This propagation delay is considerably less than the delay incurred in the circuit of FIG. 12. Also, the circuit of FIG. 14 provides a sharper edge in the output signal transitions.

The AND function in CLB 1300 may be provided, for example, by a separate AND gate or a lookup table. However, where there are up to nine CLB inputs (i.e., up to nine long lines), they may be combined, using a single CLB, in a pair of 4-input function generators cascaded with a 3-input function generator, all three being implemented as AND gates. A CLB having this capability is provided in the XC4000 Series FPGAs from Xilinx, Inc. The XC4000 Series CLB is described on pages 4–11 through 4–13 of the Xilinx Data Book.

When a single CLB is used, the number of CLB logic inputs imposes a limit on the number of long lines that can be combined as in FIG. 13. However, by cascading CLBS, the number of long lines can be further increased beyond the number of inputs in a single CLB.

Seventh Embodiment

FIG. 14 shows another embodiment of a wired AND function carried out by a circuit comprising two long lines. The circuit of FIG. 14 is similar to that of FIG. 12 except that the two long lines 1200, 1201 are not coupled to one another. Instead, long line 1200 is coupled through interconnect 1402 to drive open-drain tristate buffer 1208 on long line 1201. Therefore, the circuit of FIG. 14 is a cascaded wired AND function with the results of the wired AND performed on long line 1200 being provided to the input of the wired AND function performed by long line 1201.

The wired AND function carried out by this circuit is a function of the inputs of tristate buffers 1204–1207 and 1209–1211. Therefore, this circuit accommodates one less input than the circuits of FIGS. 12 and 13. However, the wired AND function can be further enlarged by coupling further long lines to the inputs of tristate buffers 1209–1211. Therefore, for wired AND configurations implemented in this fashion with X long lines having Y tristate buffers each, a wired AND function having X(Y−1)+1 inputs can be implemented, where X is less than or equal to Y+1.

Because of the cascade formation of the two wired AND circuits, the propagation delay of the circuit of FIG. 14 comprises the sum of the two wired AND circuit delays plus the delay for the interconnect between the two, or $$T_{PROP}=2T_{PUF}+T_{IC}$$

The configuration of FIG. 14 may be preferred to that of FIG. 13 when $T_{PUF}$ is less than $T_{ILO}$, when CLBs are needed for other purposes, or when the output signal OUT is required to drive a large or distant load.

Eighth Embodiment

Figure 15:
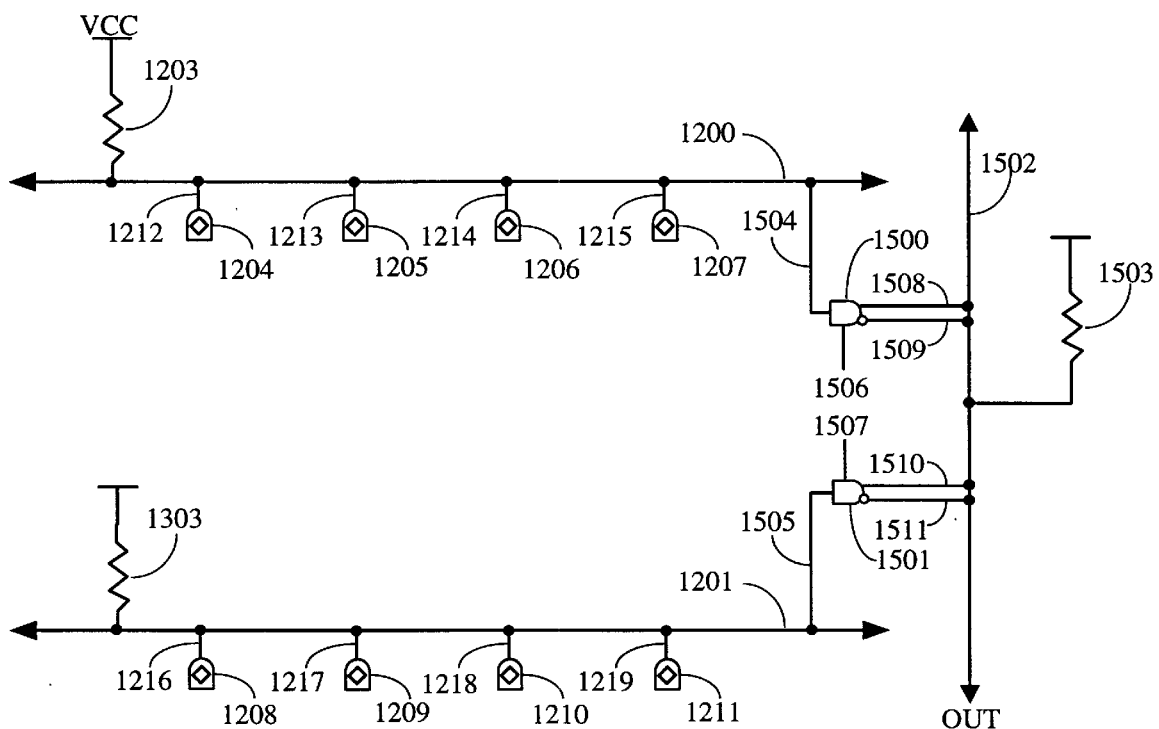
FIG. 15 is a block diagram of a wide wired logic function implemented using tristate buffers and three long lines.

FIG. 15 shows a further embodiment of a wired AND function implemented in a programmable logic device having an additional available long line, preferably perpendicular to the long lines previously described. This additional long line may, for example, be implemented as an "edge decoder", as in the Xilinx XC4000 Series FPGAs. The Xilinx XC4000 Series edge decoders are described on page 4–31 of the Xilinx Data Book. An edge decoder is also described in detail by Freeman et al in U.S. Pat. No. 5,140,193, "Programmable Connector for Programmable Logic Device", which is incorporated herein by reference and title to which is held by the assignee hereof.

The embodiment of FIG. 15 resembles that of FIG. 12, except that long line 1201 is coupled via pullup resistor 1303 to VCC and long lines 1200, 1201 are not coupled together. Instead, the circuit comprises selectable wired AND input gates 1500, 1501, line node 1502, and pullup resistor 1503. Line node 1502 is coupled to VCC via pullup resistor 1503. Selectable wired AND input gate 1500 is coupled to line node 1502 via either interconnect 1508 or inverting interconnect 1509. Select signal 1506 determines which of interconnects 1508, 1509 is active. Similarly, selectable wired AND input gate 1501 is coupled to line node 1502 via either interconnect 1510 or inverting interconnect 1511 depending on the state of select signal 1507. Long line 1200 is cascaded into the edge decoder via interconnect 1504 coupled to selectable wired AND input gate 1500. Long line 1201 is cascaded into the edge decoder via interconnect 1505 coupled to selectable wired AND input gate 1501.

The propagation delay for the circuit of FIG. 15 is equal to the sum of the delay through one long line, the delay of the interconnect between the long lines and the edge decoder, and the delay of the edge decoder, or:

$$T_{PROP}=T_{PUF}+T_{IC}+T_{DEC}$$

where $T_{DEC}$ is the edge decoder delay. This delay is similar to that of the circuit of FIG. 14, except that the edge decoder is typically designed to be a fast wired AND specifically for edge decoding functions and therefore may provide superior performance over wired AND functions cascaded through the standard long line. This embodiment of the invention may therefore be said to provide an "extension" or "enhancement" of the edge decoder in that the edge decoder can now decode much wider addresses than was previously possible.

The selectable inverted signals provided by the wired AND input gates allow for the inversion of the portions of the wired AND function generated by each of long lines 1200, 1201, so that other logical functions may be performed. For instance, if inverted interconnects 1509, 1511 are selected, the edge decoder performs a wired NOR function of the wired AND outputs received from long lines 1200, 1201. Using this type of logic, wide AND/OR functions with inverted outputs can be implemented. While not all functions can be implemented as AND functions, all combinational logic functions can be decomposed into AND/OR functions. Thus, by using the present invention greater functionality, wider wired logic functions, and reduced time delays can be achieved.

A method and apparatus for combining tristate buffers into wide logic functions and busses with a large number of drivers has been described in conjunction with one or more specific embodiments. Those having skill in the relevant arts of the invention will now perceive various modifications and additions which may be made as a result of the disclosure herein. For example, the embodiments described herein are discussed primarily in the context of reprogrammable FPGAs. However, the invention can also be applied to other programmable logic devices such as mask-programmed devices or devices programmed with antifuses, or to non-programmable devices, or to a combination thereof. Moreover, some components are shown directly connected to one another while others are shown connected via intermediate components. In each instance the method of interconnection establishes some desired electrical communication between two or more circuit nodes. Such communication may often be accomplished using a number of circuit configurations, as will be understood by those of skill in the art. Further, tristate buffers other than those shown herein can be used, and so forth. Accordingly, all such modifications and additions are deemed to be within the scope of the invention, which is to be limited only by the appended claims and their equivalents.

What is claimed is:

1. A circuit implemented in a programmable logic device, comprising:

an array of configurable logic blocks (CLBs);

an array of lines distributed across said circuit and comprising a first line and a second line, each of said first and second lines being configured to be resistively coupled to a voltage supply;

an array of tristate buffers distributed about said circuit to couple each of said CLBs to an adjacent line, said array of tristate buffers comprising a first plurality of tristate buffers and a second plurality of tristate buffers, said first plurality of tristate buffers being configured to have open-drain interconnections with said first line, said second plurality of tristate buffers being configured to have open-drain interconnections with said second line; and means for combining a first input signal and a second input signal to form a combined logic function, said first input signal being provided by said first line and said second input signal being provided by said second line.

2. The circuit of claim 1, wherein said means for combining comprises one of said array of CLBs.

3. The circuit of claim 2 wherein said one of said array of CLBs is configured to perform an AND function of said first and second input signals.

4. The circuit of claim 2, wherein said one of said array of CLBs comprises a function generator.

5. The circuit of claim 4 wherein said function generator is configured as an AND gate.

6. The circuit of claim 1 wherein said first line and said first plurality of tristate buffers form a first wired logic function.

7. The circuit of claim 6 wherein said second line and said second plurality of tristate buffers form a second wired logic function.

8. The circuit of claim 7 wherein said combined logic function is an AND function of said first and second wired logic functions.

9. The circuit of claim 1 wherein said combined logic function is an AND function.

10. The circuit of claim 1, wherein said means for combining comprises:

a third line configured to be resistively coupled to said voltage supply; and a third plurality of open-drain tristate buffers selectively driving said third line and receiving a plurality of tristate buffer control signals, said plurality of tristate buffer control signals comprising said first and second input signals.

11. The circuit of claim 1 wherein said means for combining comprises an edge decoder.

12. The circuit of claim 11 wherein said edge decoder comprises:

a plurality of input gates providing a plurality of selectably invertible output signals on a plurality of output terminals; and a line node coupled to said plurality of output terminals and resistively coupled to said voltage supply.

13. The circuit of claim 12 wherein said edge decoder is configured such that all of said selectably invertible output signals are inverted.

14. A circuit comprising:

a first line resistively coupled to a voltage supply;

a second line resistively coupled to said voltage supply;

a first plurality of open-drain tristate buffers coupled to said first line and having a first plurality of tristate buffer data terminals and a first plurality of tristate buffer control terminals;

a sub-circuit performing an AND function, said sub-circuit having input terminals coupled to said first plurality of tristate buffer control terminals and further having an output terminal; and a second plurality of open-drain tristate buffers coupled to said second line and having a second plurality of tristate buffer data terminals and a second plurality of tristate buffer control terminals;

wherein said first line is coupled to one of said second plurality of tristate buffer data terminals of a given tristate buffer, and wherein said output terminal of said sub-circuit is coupled to one of said second plurality of tristate buffer control terminals of the given tristate buffer.

15. The circuit of claim 14 wherein said first line and said first plurality of open-drain tristate buffers form a wired logic function.

16. A programmable circuit comprising:

an array of configurable logic blocks (CLBs);

an array of lines distributed across said circuit and comprising a first line and a second line, each of said first and second lines being configured to be resistively coupled to a voltage supply;

an array of tristate buffers distributed about said circuit to couple each of said CLBs to an adjacent line, said array of tristate buffers comprising a first plurality of tristate buffers and a second plurality of tristate buffers, said first plurality of tristate buffers being configured to have open-drain interconnections with said first line, said second plurality of tristate buffers being configured to have open-drain interconnections with said second line; and a sub-circuit performing an AND function, said sub-circuit having input terminals coupled to control terminals of said first plurality of tristate buffers, and further having an output terminal;

wherein said first line is configurably coupled to a data input terminal of one of said second plurality of tristate buffers, and wherein said output terminal of said sub-circuit is configurably coupled to a control terminal of said one of said second plurality of tristate buffers.

* * * * *